United States Patent
Megason et al.

(10) Patent No.: US 6,912,124 B2
(45) Date of Patent: Jun. 28, 2005

(54) LEVER SYSTEM FOR MOVING A COMPONENT WITHIN A CHASSIS

(75) Inventors: George D. Megason, Houston, TX (US); Brett Dwayne Roscoe, Houston, TX (US); Christian H. Post, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 494 days.

(21) Appl. No.: 10/094,779

(22) Filed: Mar. 11, 2002

(65) Prior Publication Data

US 2002/0104396 A1 Aug. 8, 2002

Related U.S. Application Data

(63) Continuation of application No. 09/542,308, filed on Apr. 4, 2000, now Pat. No. 6,354,164.

(51) Int. Cl.$^7$ ................................................. G06F 1/16
(52) U.S. Cl. ....................... 361/685; 360/138; 439/905; 16/104.33
(58) Field of Search ................................. 361/679–687, 361/724–727; 360/137–138; 439/157, 159, 905; 165/80.4, 104.33

(56) References Cited

U.S. PATENT DOCUMENTS

| | | | |
|---|---|---|---|
| 4,982,303 A | 1/1991 | Krenz | 360/137 |
| 5,722,843 A | 3/1998 | Kerckhof et al. | 439/157 |
| 5,829,994 A | 11/1998 | Oda et al. | 439/157 |
| 6,099,330 A | 8/2000 | Gundermann et al. | 439/157 |
| 6,256,196 B1 * | 7/2001 | Lima | 361/687 |
| 6,272,005 B1 * | 8/2001 | Jensen et al. | 361/680 |
| 6,354,164 B1 * | 3/2002 | Megason et al. | 74/109 |
| 6,490,153 B1 * | 12/2002 | Casebolt et al. | 361/685 |

* cited by examiner

Primary Examiner—Hung Van Duong

(57) ABSTRACT

A lever system deploys a pinion gear that engages a pinion gear receiving portion. A handle is attached to the pinion gear to rotate the pinion gear between a retain position and a release position. The pinion gear receiving portion is attached to a first object and the pinion gear is pivotably mounted to a second object that may be moved with respect to the first object. The design of the pinion gear receiving portion and the pinion gear ensure linear travel of the second object as the pinion gear is rotated between the retain position and the release position. Additionally, the pinion gear and the receiving portion include contours that prevent relative linear motion in all directions.

33 Claims, 5 Drawing Sheets

US 6,912,124 B2

LEVER SYSTEM FOR MOVING A COMPONENT WITHIN A CHASSIS

This application is a Continuation of application Ser. No. 09/542,308, filed Apr. 4, 2000, now U.S. Pat. No. 6,354,164, issued Mar. 12, 2002.

FIELD OF THE INVENTION

The present invention relates generally to a lever system for moving one object with respect to another, and particularly to a lever system that utilizes a rack gear and a pinion gear that are particularly amenable to facilitating the plugging and unplugging of components having multipin connectors.

BACKGROUND OF THE INVENTION

A variety of lever systems have long been used to provide mechanical advantage in moving a given object. The mechanical advantage permits a user to perform tasks that would otherwise be difficult. Depending on the design of the lever system, it may be integrated with or separate from the object being moved.

In certain applications, it is desirable to have a lever system that provides a very controlled movement of one object with respect to another object. For example, in the assembly or disassembly of certain electrical components in systems, such as personal computers, servers, etc., it is helpful to gain mechanical advantage in plugging and unplugging components while providing a very controlled movement of the objects or components with respect to one another.

Commonly, printed circuit boards or other components utilize one or more multipin plugs that facilitate an electrical and mechanical connection with, for example, a motherboard or backplane. Gaining mechanical advantage in plugging and unplugging such components has become more important as the pin count in multipin connectors has increased, thus requiring greater force to plug or unplug the connectors. Similarly, it has become increasingly important to provide linear travel of one object with respect to another as the multipin connectors are plugged and unplugged, thereby avoiding damage to the connector. Also, it is often helpful to limit the movement of one object with respect to another object after the connection is completed. The secure connection prevents fatigue or other damage that may affect the connection.

It would be advantageous to have a lever system that provided substantial mechanical advantage while maintaining controlled movement of one object with respect to another. It also would be advantageous to achieve restricted relative movement of the objects upon completion of connection of the objects or other desired result.

SUMMARY OF THE INVENTION

The present invention features a lever system for moving a first object with respect to a second object. The lever system comprises a pinion gear pivotably mounted to the first object for pivotable motion about a pivot axis. A handle is connected to the pinion gear for movement between a release position and a retain position. Additionally, a pinion gear reception portion is mounted on the second object. The reception portion has a rack gear and a guide surface generally opposite the rack gear. The guide surface is positioned to maintain the pinion gear in engagement with the rack gear as the handle is moved from the release position to the retain position.

According to another aspect of the present invention, a lever system is provided for moving a first object with respect to a second object. The system includes a gear member mounted to the first object and a gear member reception portion mounted to the second object. When the gear member and the reception portion are engaged and rotated with respect to each other, the gear member is moved to a retained position. The design of the gear member and the reception portion prevent relative linear movement in all directions when the gear member is in the retained position.

According to another aspect of the present invention, a lever system is provided that includes a first object and a second object moveable with respect to the first object. A combined pinion gear and handle are pivotably mounted to the first object for pivotable motion about a pivot axis. The pinion gear and handle may be moved between a release position and a retain position. The pinion gear is engageable with a pinion gear reception portion that is mounted on the second object. The reception portion includes a rack gear and a guide surface generally opposite the rack gear. The guide surface is located to maintain the pinion gear in engagement with the rack gear as the handle is moved from the release position to the retain position. The pinion gear and the reception portion may be designed to prevent any lateral movement along the pivot axis once engaged.

BRIEF DESCRIPTION OF THE DRAWINGS

The invention will hereafter be described with reference to the accompanying drawings, wherein like reference numerals denote like elements, and.

DETAILED DESCRIPTION OF THE PREFERRED EMBODIMENTS

Figure 1:
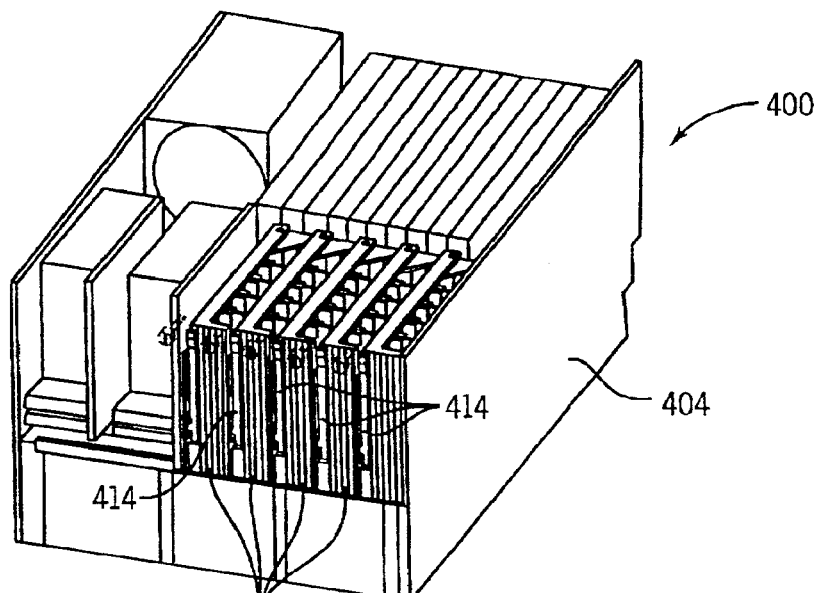
FIG. 1 is a perspective view of an overall system utilizing one embodiment of a lever system, according to an exemplary embodiment of the present invention.

Referring generally to FIG. 1, a system 400 of objects that may be moved relative to one another is illustrated. One or more first objects 402 are moveable relative to a second object 404. In the particular embodiment illustrated, first object or objects 402 each comprise a module that may be electrically and mechanically engaged and disengaged from the second object 404 which is a cabinet or chassis. In a variety of computer/electrical systems, such as personal computers, serves, etc. some form of the illustrated objects exists.

Figure 2:
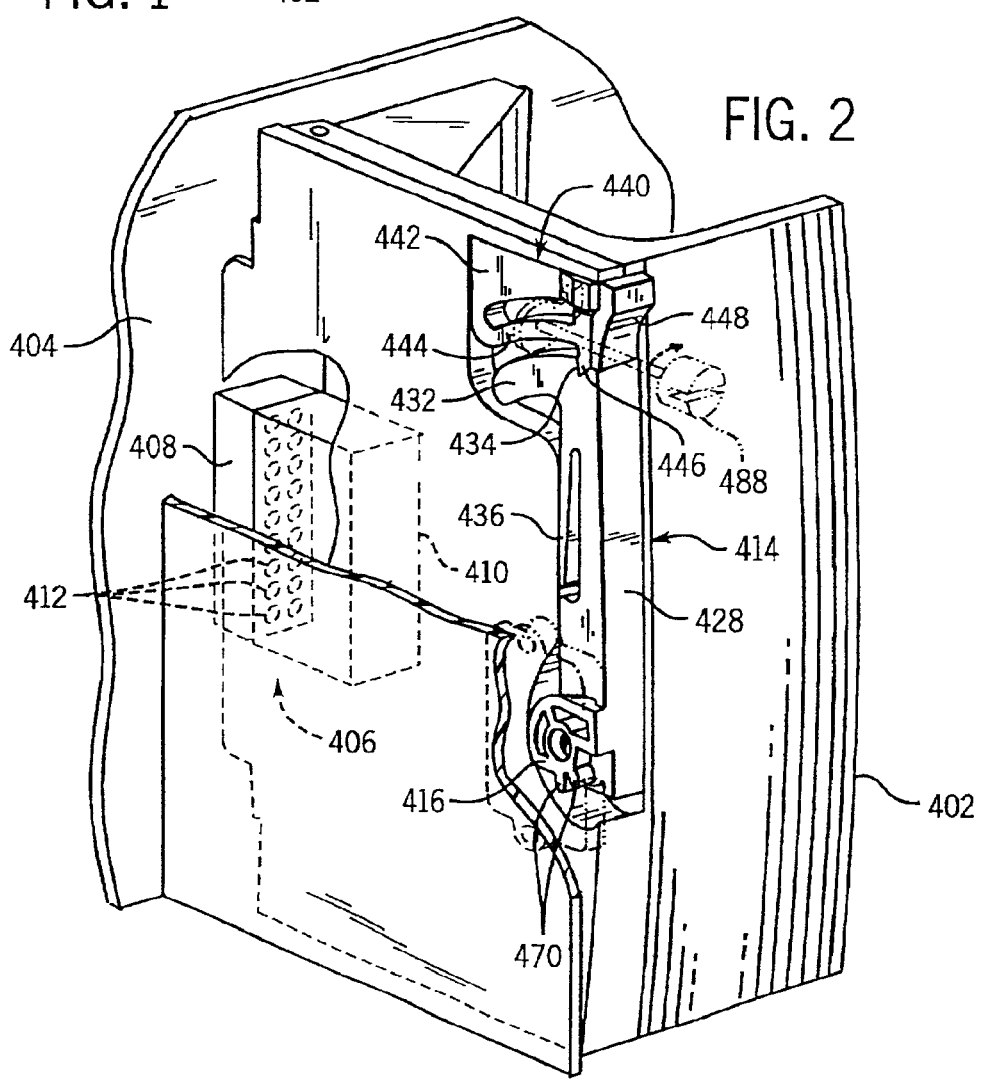
FIG. 2 is a perspective view of an individual lever system connected to two objects that are movable with respect to one another.

For example, a variety of computer or server related systems can be configured to permit the use of pluggable components, i.e. first objects 402, that may be connected to, for example, a motherboard or backplane of second object 404 across a plug connector 406. (See FIG. 2). A typical connector 406 includes a multipin plug portion 408 connected as part of second object 404 and a corresponding plug portion 410 connected as part of first object 402. Plug portions 408 and 410 typically are electrically and mechanically interconnected via a plurality of pins 412. Generally, a greater number of pins in the multipin connector, requires greater force to engage or disengage plug portions 408 and 410. Hence, a lever system 414 is used to facilitate movement of each first object 402 with respect to second object 404 which, in the illustrated example, permits the plugging and unplugging of connector 406.

Referring generally to FIGS. 3 through 6, an exemplary, preferred embodiment of lever system 414 is illustrated. Lever system 414 includes a pinion gear 416 pivotably mounted to first object 402 for pivotable motion about a pivot axis 418. Pinion gear 416 is designed to engage a pinion gear reception portion 420 mounted to second object 404. Reception portion 420 includes a slot 426 into which pinion gear 416 may be rotated.

Figure 3:
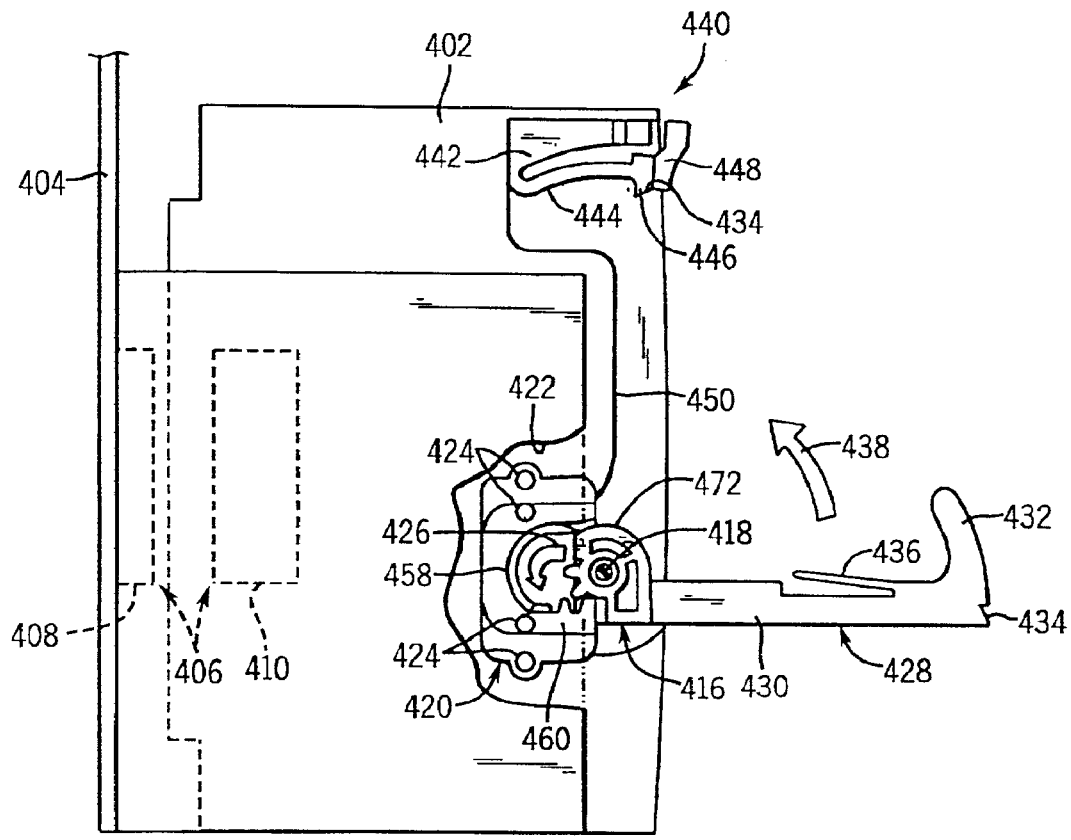
FIG. 3 is a side view of the lever system illustrated in FIG. 2 showing the handle in a release position.
Figure 4:
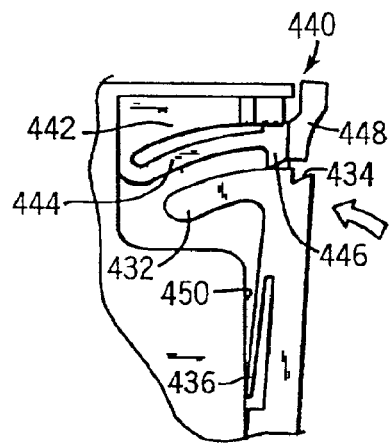
FIG. 4 is an enlarged view of a latch mechanism of the lever system illustrated in FIG. 3.

If second object 404 is a cabinet or chassis as illustrated in FIG. 1, reception portion 420 can be mounted to an interior wall 422 illustrated in cut-away form in FIG. 3. Pinion gear reception portion 420 potentially is mounted to second object 404 in a variety of ways. For example, reception portion 420 may be molded as a unitary piece with the second object. Other methods include adhesives, fasteners, or a plurality of pins 424 that may be interference fit or heat sealed in corresponding openings in second object 404.

A handle or lever 428 is connected to pinion gear 416. An exemplary embodiment of handle 428 utilizes a stem 430 and a gripping portion 432 disposed at an opposite end of stem 430 from pinion gear 416. Handle 420 preferably also includes a notch 434 and a spring member 436, as best illustrated in FIG. 3.

Figure 5:
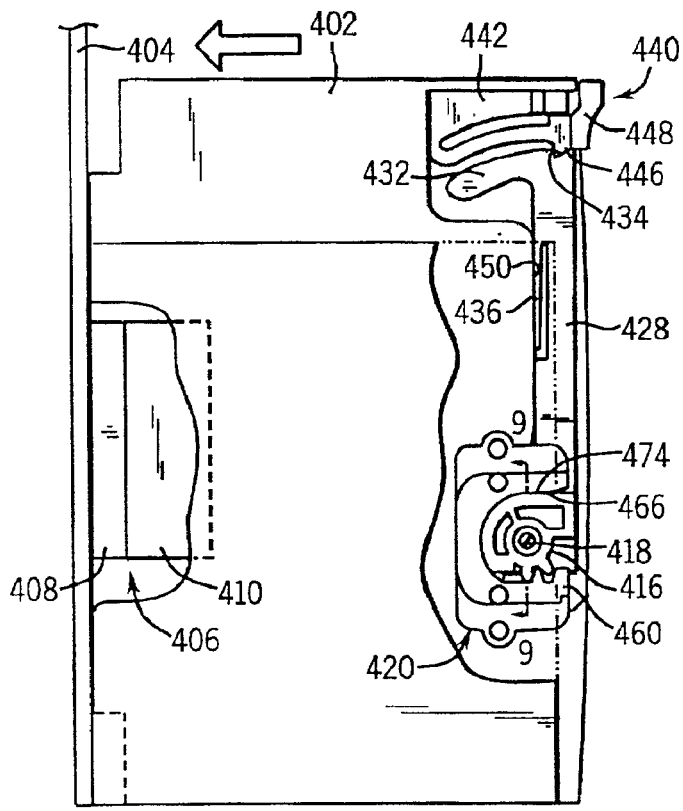
FIG. 5 is a side view of the lever system illustrated in FIG. 3 with the handle in a retain position.

Pinion gear 416 may be engaged with pinion gear reception portion 420 and, along with handle 428, rotated between an open or release position, as illustrated in FIG. 3, and a closed or retain position, as illustrated in FIG. 5. In the release position, first object 402 may readily be separated from second object 404. In the particular example illustrated, plug portion 408 and corresponding plug portion 410 are separated. If, however, it is desired to move first object 402 into engagement with second object 404, pinion gear 416 is moved into engagement with pinion gear reception portion 420, and handle 428 is pivoted in the direction of arrow 438 to the retain position, as shown in FIG. 5. As handle 428 is moved to the retain position, first object 402 is moved in a precise, linear fashion into engagement with second object 404. In the exemplary embodiment shown, corresponding plug portion 410 is moved linearly into engagement with plug portion 408.

A latch mechanism 440 preferably is used to retain handle 428 and pinion gear 416 in the retain position. As illustrated best in FIG. 4, latch mechanism 440 includes a base 442 that may be connected to first object 402. A spring member 444 is connected to base 442 and serves to bias a catch 446 away from base 442. Additionally, a handle or finger grip 448 is disposed on a distal end of spring member 444.

As handle 428 is rotated from the release position (FIG. 3) to the closed position (FIG. 5), gripping portion 432 flexes spring member 444 towards base 442. Simultaneously, spring member 436 is moved against an interference surface 450 that is typically located on first object 402. Upon movement of the handle 428 to the fully closed or retain position, catch 446 snaps into notch 434 and maintains handle 428 and pinion gear 416 in the retain position.

To release handle 428, latch mechanism 440 is moved out of interference with notch 434 by pressing against finger grip 448 to flex spring member 444 towards base 442. (See FIG. 6). When catch 446 is disengaged from notch 434, spring member 436 begins to move handle 428 away from the retain position. This allows an operator to grab gripping portion 432 or stem 430 to pivot handle 428 and pinion gear 416 to a release position. As pinion gear 416 is rotated to the release position, it moves first object 402 in a linear fashion with respect to second object 404 to disengage connector 406 or to serve other desired ends.

Figure 9:
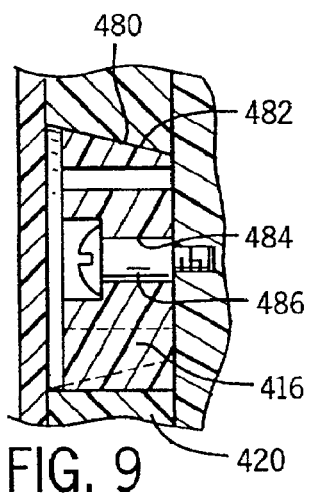
FIG. 9 is a cross-sectional view taken generally along line 9—9 of FIG. 5.
Figure 6:
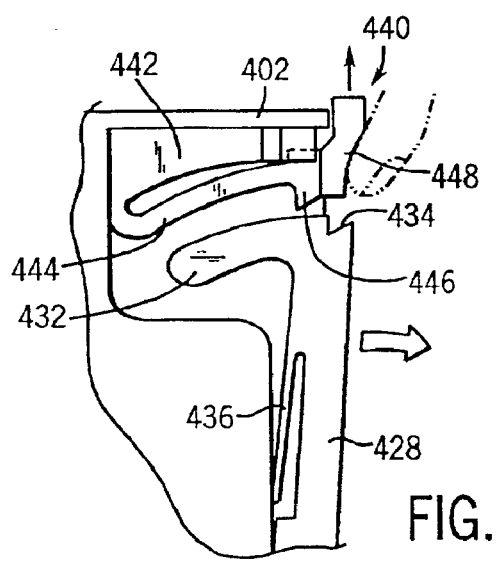
FIG. 6 is a side view of the latch mechanism illustrated in FIG. 4 but showing release of the handle.
Figure 7:
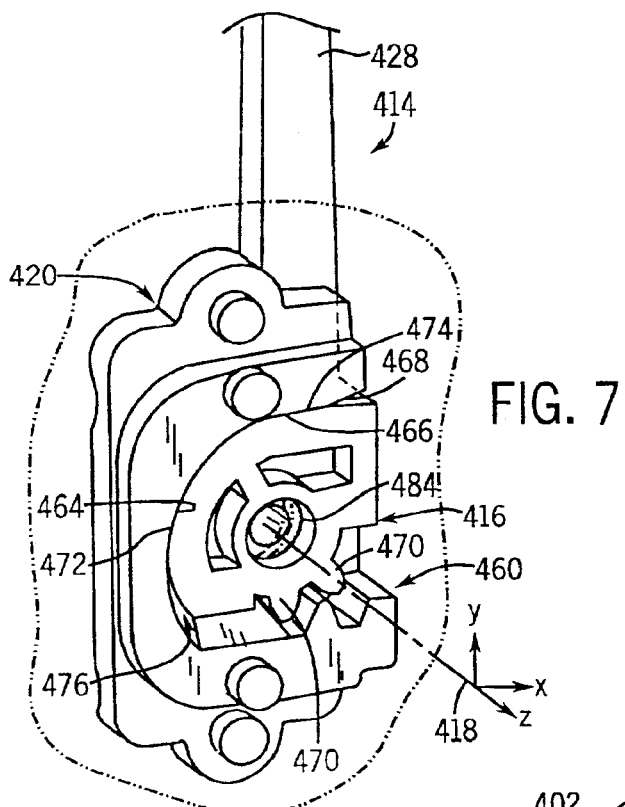
FIG. 7 is a perspective view of the pinion gear engaged with the rack gear.
Figure 8:
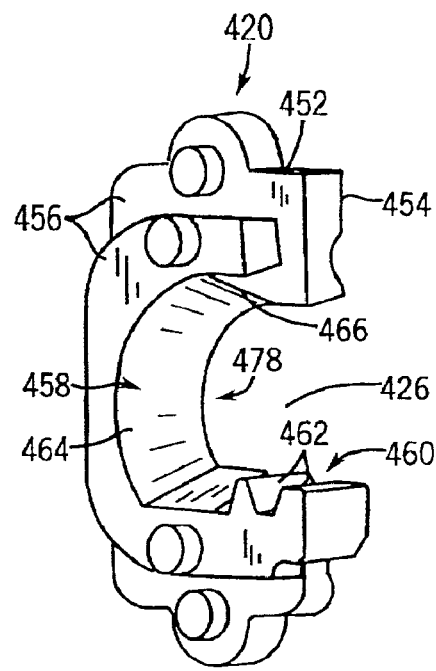
FIG. 8 is a perspective view of the pinion gear receiving portion.

The configuration and operation of pinion gear 416 and pinion gear reception portion 420 can be better understood with additional reference to FIGS. 7, 8 and 9, Pinion gear reception portion 420 includes a base structure 452 having an outer surface 454 and an inner mounting surface or region 456 disposed generally opposite outer surface 454. Mounting region 456 generally abuts against or is integrally formed with second object 404.

Slot 426 is formed in base structure 452 and is defined by an interior surface 458. Interior surface 458 includes a rack gear region 460 having at least one and preferably two teeth 462 that form a rack gear. Interior surface 458 also includes a distal surface 464 that generally extends between rack gear region 460 and a guide surface 466 disposed generally opposite rack gear region 460. Distal surface 464 generally defines the deepest region of slot 426 relative to its open end. Preferably, interior surface 452 also includes a beveled lead-in region 468 adjacent guide surface 466 at the open end of slot 426.

Pinion gear 416 includes at least one and preferably a pair of teeth 470 designed to engage teeth 462 of rack gear region 460. As first object 402 and pinion gear 416 are moved into engagement with pinion gear reception portion 420 and second object 404 (see FIG. 3), teeth 470 are positioned for engagement with teeth 462 of rack gear 460. Then, as handle 428 is pivoted to the retain position (see FIG. 5), teeth 470 of pinion gear 416 drive first object 402 in a linear fashion along linear rack gear region 460 until pinion gear 416 and handle 428 are in the retain position. At this position, the engagement of teeth 470 and teeth 462 prevent any linear motion of pinion gear 416 or first object 402 relative to second object 404 along rack gear region 460, i.e. along the x-axis, as illustrated in FIG. 7. Additionally, pinion gear 416 includes a distal region 472 that abuts against distal surface 464 of reception portion 420 when pinion gear 416 is in the retain position. This abutting engagement further prevents any movement in the x direction. Pinion gear 416 also includes a stop surface 474 disposed generally opposite teeth 470 for abutting engagement with guide surface 466 of reception portion 420 when pinion gear 416 is in the retain position. The guide surface 466 cooperates with rack gear region 460 to prevent any relative linear motion of pinion gear 416 or first object 402 in a direction perpendicular to rack gear region 460, i.e. along the y-axis, as illustrated in FIG. 7.

Preferably, lever system 414 also includes a lateral interference region 476. This region is designed to prevent lateral movement of pinion gear 416 with respect to reception portion 420 along pivot axis 418, i.e. along the z-axis as illustrated in FIG. 7. A preferred lateral interference region includes a sloped or angled region 478 disposed along interior surface 458 of pinion gear reception portion 420. A corresponding sloped or angled region 480 is formed along an outer surface 482 of pinion gear 416. (See FIG. 9). The lateral interference region 476 may be formed generally at distal region 472 of pinion gear 416 and along distal surface 464 of reception portion 420. It should be noted, however, that the interference region can be formed at different points or in different forms to prevent lateral movement along the z-axis direction.

The unique combination of interfering teeth and surfaces between pinion gear 416 and pinion gear reception portion 420 prevents any linear motion of pinion gear 416 relative to reception portion 420 once pinion gear 416 and handle 428 are in the retain position. This ensures a secure and stable interlocking of first object 402 and second object 404. The secure interlock is particularly beneficial when using the lever system to secure pluggable components having multipin connectors.

As illustrated in FIG. 9, pinion gear 416 also preferably includes a pivot opening 484 to permit pivotable motion of pinion gear 416 and handle 428 about a pivot pin 486. The illustrated pivot pin 486 is a screw threaded into first object 402. However, a variety of pivot pins including injection molded pins, can be used in forming a point of pivotable motion.

Figure 10:
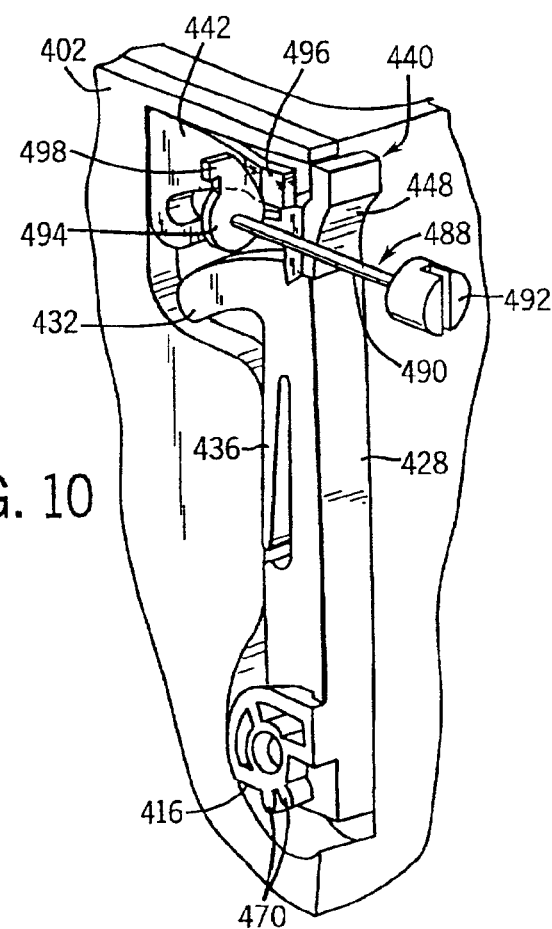
FIG. 10 is a perspective view of the lever system illustrated in FIG. 2 with the addition of a release prevention mechanism.
Figure 11:
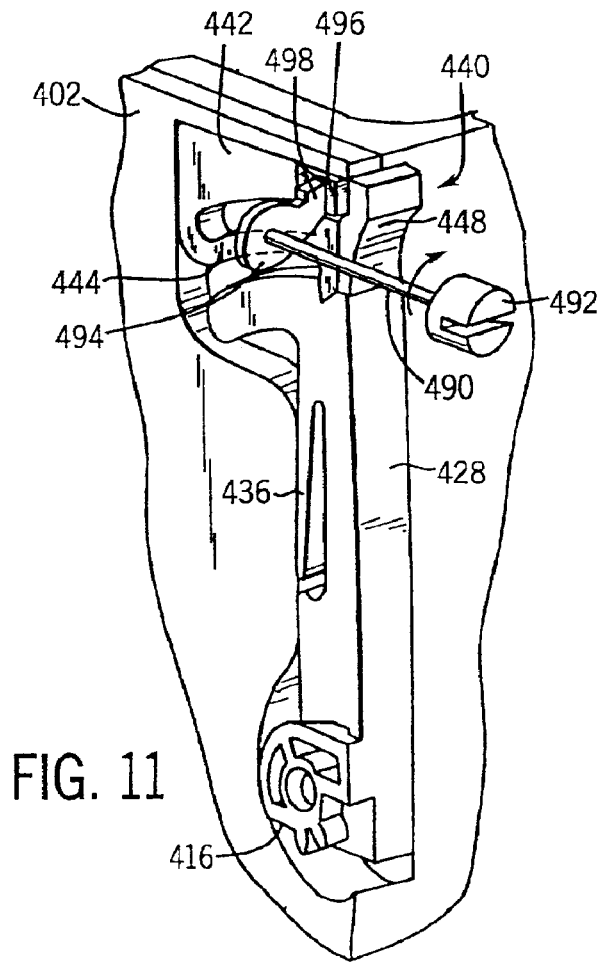
FIG. 11 is a perspective view similar to FIG. 10 showing the release prevention mechanism in a hold or locked position.

Referring generally to FIGS. 10 and 11, lever system 414 also may include a release prevention mechanism 488 that prevents the inadvertent release of handle 428 from latch mechanism 440. An exemplary embodiment of security mechanism 488 includes a shaft 490 having a head 492 at one end and a cog 494 at an opposite end. Typically, shaft 490 is rotatably mounted in either first object 402 or second object 404 such that cog 494 is positioned adjacent the side of latch mechanism 440, as illustrated best in FIG. 10. In this embodiment, latch mechanism 440 includes a flexible tab 496 that moves generally transversely to the movement of spring member 444 and catch 446. Flexible tab 496 is sized to fit behind catch 446 when catch 446 is engaged with notch 434 of handle 428.

Cog 494 includes an extended portion 498 positioned to force flexible tab 496 into the space behind catch 446, as illustrated best in FIG. 11. Thus, by rotating head 492 in a generally clockwise direction (after handle 428 and latch mechanism 440 are in the retain position), the flexible tab 496 is moved into a position to block movement of finger grip 448 and release of handle 428. To release handle 428, extended portion 498 must be rotated away from flexible tab 496, such that flexible tab 496 springs back from its interfering position with catch 446. Then, finger grip 448 and catch 446 may be moved to permit release of handle 428.

It will be understood that the foregoing description is of a preferred embodiment of this invention, and that the invention is not limited to the specific forms shown. For example, a variety of handle, pinion gear and pinion gear reception portions can be formed to accommodate specific applications. The materials utilized to form the lever system may vary, and the objects to be moved relative to one another will depend on the specific application. These and other modifications may be made in the design and arrangement of the elements without departing from the scope of the invention as expressed in the appended claims.

What is claimed is:

1. A computer based system, comprising:
   a chassis;
   a pluggable component selectively engageable with the chassis; and
   a lever system to facilitate engagement and disengagement of the pluggable component from the chassis, wherein the lever system restricts movement of the pluggable component relative to the chassis in all directions until actuated and wherein the lever system comprises a near mechanism.

2. The computer based system as recited in claim 1, wherein the chassis comprises a personal computer chassis.

3. The computer based system as recited in claim 1, wherein the chassis comprises a server chassis.

4. The computer based system as recited in claim 1, wherein the lever system having a gear mechanism comprises:
   a pinion gear pivotably mounted to one of the chassis and the pluggable component for pivotable motion about a pivot axis;
   a handle connected to the pinion gear for movement between a release position and a retain position; and
   a pinion gear reception portion on the other of the chassis and the pluggable component, the pinion gear reception portion having a rack gear and a guide surface generally opposite the rack gear, wherein the guide surface is located to maintain the pinion gear in engagement with the rack gear as the handle is moved from the release position to the retain position.

5. The computer based system as recited in claim 1, wherein the pluggable component comprises a multipin plug connector portion and the chassis encloses a corresponding multipin plug connector portion positioned to receive the multipin plug connector portion when the pluggable component is engaged with the chassis.

6. The computer based system as recited in claim 4, wherein the pinion gear includes at least one tooth disposed to ensure movement of the pivot axis generally along a straight line as the handle is moved between the release position and the retain position.

7. The computer based system as recited in claim 4, wherein the pinion gear includes a stop surface located to move into engagement with the guide surface when the handle is in the retain position.

8. The computer based system as recited in claim 4, wherein the pinion gear reception portion includes a lateral interference region to prevent lateral movement of the pinion gear along the pivot axis with respect to the pinion gear reception portion.

9. The computer based system as recited in claim 4, wherein the pinion gear includes a tapered stop surface disposed to engage the tapered surface when the handle is in the closed position.

10. The computer based system as recited in claim 4, wherein the pinion gear includes a stop surface located to move into engagement with the guide surface when the handle is in the retain position.

11. The computer based system as recited in claim 9, wherein at least a portion of the tapered surface extends beyond the stop surface.

12. The computer based system as recited in claim 10, wherein the pinion gear reception portion includes a lateral interference region to prevent lateral movement of the pinion gear along the pivot axis with respect to the pinion gear reception portion.

13. The computer based system as recited in claim 12, wherein the lateral interference region includes a tapered surface disposed at an angle with respect to the pivot axis when the pinion gear is engaged with the pinion gear reception portion.

14. A method of moving a component within a chassis, comprising:

engaging a lever system having a gear member between the component and the chassis to facilitate movement of the component between a retained position and a release position relative to the chassis; and configuring the lever system to prevent inadvertent movement of the component to the release position and to prevent lateral movement of the component with respect to the chassis.

15. The method as recited in claim 14, further comprising pivoting a lever to rotate the gear member to force the component into the retained position within the chassis.

16. The method as recited in claim 14, further comprising releasably pivoting the lever system to rotate the gear member to force the component to the release position.

17. The method as recited in claim 14, wherein preventing inadvertent movement to the release position comprises engaging the gear member with a gear member reception portion.

18. The method as recited in claim 14, further comprising biasing the lever away from the retained position with a spring member.

19. The method as recited in claim 15, further comprising electrically coupling the component to a plug connector portion positioned within the chassis when the component is forced into the retained position.

20. A system for moving a releasable computer component with respect to a computer chassis, comprising:

a gear member mounted to the releasable computer component; and a gear member reception portion mounted to the computer chassis wherein as the gear member and gear member reception portion are engaged and rotated with respect to each other, the gear member may by moved to a retained position at which position the gear member restricts linear movement in all directions.

21. The computer based system as recited in claim 20, further comprising a handle connected to the gear member to pivot the gear member between a retain position and a release position.

22. The computer based system as recited in claim 20, wherein the computer chassis comprises a server chassis.

23. The computer based system as recited in claim 21, wherein the gear member comprises a pinion gear having at least one tooth.

24. The computer based system as recited in claim 23, wherein the pinion gear is pivotably mounted to the first object about a pivot axis.

25. The computer based system as recited in claim 24, wherein the pinion gear reception portion includes a lateral interference region to prevent lateral movement of the pinion gear along the pivot axis with respect to the pinion gear reception portion.

26. The computer based system as recited in claim 25, further comprising a spring member positioned to bias the handle away from the retained position.

27. A system for moving a releasable computer component with respect to a computer chassis, comprising:

a gear member mounted to the releasable computer chassis; and a gear member reception portion mounted to the releasable computer component wherein as the gear member and gear member reception portion are engaged and rotated with respect to each other, the gear member may by moved to a retained position at which position the gear member restricts linear movement in all directions.

28. The computer based system as recited in claim 27, further comprising a handle connected to the gear member to pivot the gear member between a retain position and a release position.

29. The computer based system as recited in claim 27, wherein the computer chassis comprises a server chassis.

30. The computer based system as recited in claim 28, wherein the gear member comprises a pinion gear having at least one tooth.

31. The computer based system as recited in claim 30, wherein the pinion gear is pivotably mounted to the first object about a pivot axis.

32. The computer based system as recited in claim 31, wherein the pinion gear reception portion includes a lateral interference region to prevent lateral movement of the pinion gear along the pivot axis with respect to the pinion gear reception portion.

33. The computer based system as recited in claim 32, further comprising a spring member positioned to bias the handle away from the retained position.

* * * * *